(12) United States Patent
Lin (10) Patent No.: US 12,342,552 B2
(45) Date of Patent: Jun. 24, 2025

(54) METHOD OF FORMING SEMICONDUCTOR STRUCTURE

(71) Applicant: NANYA TECHNOLOGY CORPORATION, New Taipei (TW)

(72) Inventor: Ya-Chin Lin, Chiayi County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 398 days.

(21) Appl. No.: 17/933,121

(22) Filed: Sep. 18, 2022

(65) Prior Publication Data

US 2024/0097002 A1 Mar. 21, 2024

(51) Int. Cl.
*H10D 1/00* (2025.01)
*H01L 21/033* (2006.01)
*H10B 12/00* (2023.01)

(52) U.S. Cl.
CPC ......... *H10D 1/045* (2025.01); *H01L 21/0335* (2013.01); *H10B 12/0387* (2023.02)

(58) Field of Classification Search
CPC ........... H01L 29/66174; H01L 21/0335; H01L 21/31144; H01L 21/32137; H01L 28/90; H10B 12/0387; H10B 12/033
See application file for complete search history.

(56) References Cited

U.S. PATENT DOCUMENTS

2011/0147939 A1* 6/2011 La Tulipe, Jr. ... H01L 21/76804
257/761

\* cited by examiner

*Primary Examiner* — Mohammad A Rahman
(74) *Attorney, Agent, or Firm* — CKC & Partners Co., LLC (57) ABSTRACT

A method of forming a semiconductor structure includes forming a dielectric stack over a substrate, in which forming the dielectric stack includes forming a first support layer, a first sacrificial layer, a second support layer, a second sacrificial layer and a third support layer in sequence. A first hard mask layer is formed over the dielectric stack. A second hard mask layer is formed over the first hard mask layer. A patterned mask is formed over the second hard mask layer. The first and second hard mask layers are etched using the patterned mask as an etch mask to form first and second hard masks, in which the first hard mask layer is etched faster than the second hard mask layer. An opening is formed in the dielectric stack to expose the substrate. A bottom electrode layer is formed in the opening of the dielectric stack.

19 Claims, 11 Drawing Sheets

METHOD OF FORMING SEMICONDUCTOR STRUCTURE

BACKGROUND

Technical Field

The present disclosure relates to a method of forming a semiconductor structure.

Description of Related Art

Capacitors are used in a wide variety of semiconductor circuits. For example, the capacitors are used in, for example, DRAM (dynamic random access memory) memory circuits or any other type of memory circuit. DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

SUMMARY

One aspect of the present disclosure is a method of forming a semiconductor structure.

According to some embodiments of the present disclosure, a method of forming a semiconductor structure includes forming a dielectric stack over a substrate, in which forming the dielectric stack includes forming a first support layer, a first sacrificial layer, a second support layer, a second sacrificial layer and a third support layer in sequence. A first hard mask layer is formed over the dielectric stack. A second hard mask layer is formed over the first hard mask layer. A patterned mask is formed over the second hard mask layer. The first hard mask layer and the second hard mask layer are etched using the patterned mask as an etch mask to form a first hard mask and a second hard mask, in which the first hard mask layer is etched faster than the second hard mask layer. An opening is formed in the dielectric stack to expose the substrate. A bottom electrode layer is formed in the opening of the dielectric stack.

In some embodiments, the method further includes etching the third support layer of the dielectric stack after etching the first hard mask layer and the second hard mask layer.

In some embodiments, wherein etching the third support layer is performed such that the second sacrificial layer of the dielectric stack is exposed.

In some embodiments, etching the first hard mask layer and the second hard mask layer is performed such that the first hard mask has a first exposed sidewall and the second hard mask has a second exposed sidewall, and a slope of the second exposed sidewall is substantially the same as a slope of the first exposed sidewall.

In some embodiments, the first hard mask layer and the second hard mask layer include semiconductor materials.

In some embodiments, the first hard mask layer includes first dopants having a first conductivity type, and the second hard mask layer includes second dopants having a second conductivity type different from the first conductivity type.

In some embodiments, the first hard mask layer has a first thickness, the second hard mask layer has a second thickness, and the second thickness is greater than the first thickness.

In some embodiments, the method further includes removing the patterned mask prior to forming the opening.

In some embodiments, the method further includes removing the second hard mask prior to forming the opening.

In some embodiments, the method further includes forming a high-k dielectric layer along a sidewall of the bottom electrode layer. A top electrode layer along a sidewall of the high-k dielectric layer to define a capacitor including the bottom electrode layer, the high-k dielectric layer and the top electrode layer in the dielectric stack.

Another aspect of the present disclosure is a method of forming a semiconductor structure.

According to some embodiments of the present disclosure, a method of forming a semiconductor structure includes forming a dielectric stack over a substrate. A first hard mask and a second hard mask is formed over the dielectric stack, in which the first hard mask includes first dopants having a first conductivity type, and the second hard mask includes second dopants having a second conductivity type different from the first conductivity type. An opening is formed in the dielectric stack using the first hard mask as an etch mask to expose the substrate. A bottom electrode layer is formed in the opening of the dielectric stack.

In some embodiments, forming the first hard mask and the second hard mask is performed such that the first hard mask is in contact with the dielectric stack and the second hard mask is in contact with the first hard mask.

In some embodiments, the first hard mask and the second hard mask include polysilicon materials.

In some embodiments, a dopant concentration of the first dopants is in a range of 0.5% to 1.5%, and a dopant concentration of the second dopants is in a range of 0.5% to 1.5%.

In some embodiments, the first hard mask has a first thickness, the second hard mask has a second thickness, and the second thickness is greater than the first thickness.

In some embodiments, the method further includes removing the first hard mask prior to forming the opening in the dielectric stack.

In some embodiments, forming the dielectric stack includes forming a first sacrificial layer over the substrate. A second sacrificial layer is formed over the first sacrificial layer.

In some embodiments, forming the dielectric stack further includes forming a first support layer over the substrate. A second support layer is formed over the first sacrificial layer. A third support layer is formed over the second sacrificial layer.

In some embodiments, the method further includes removing the second sacrificial layer after forming the bottom electrode layer. The first sacrificial layer is removed to expose the first support layer.

In some embodiments, the method further includes forming a high-k dielectric layer along a sidewall of the bottom electrode layer. A top electrode layer along a sidewall of the high-k dielectric layer to define a capacitor including the bottom electrode layer, the high-k dielectric layer and the top electrode layer in the dielectric stack.

In the aforementioned embodiments, since the first hard mask layer is etched faster than the second hard mask layer, a profile of the first hard mask can be improved. As such, a profile of the capacitor formed in the subsequent etching and deposition processes can be improved and decreased capacitance of the capacitor can be avoided.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
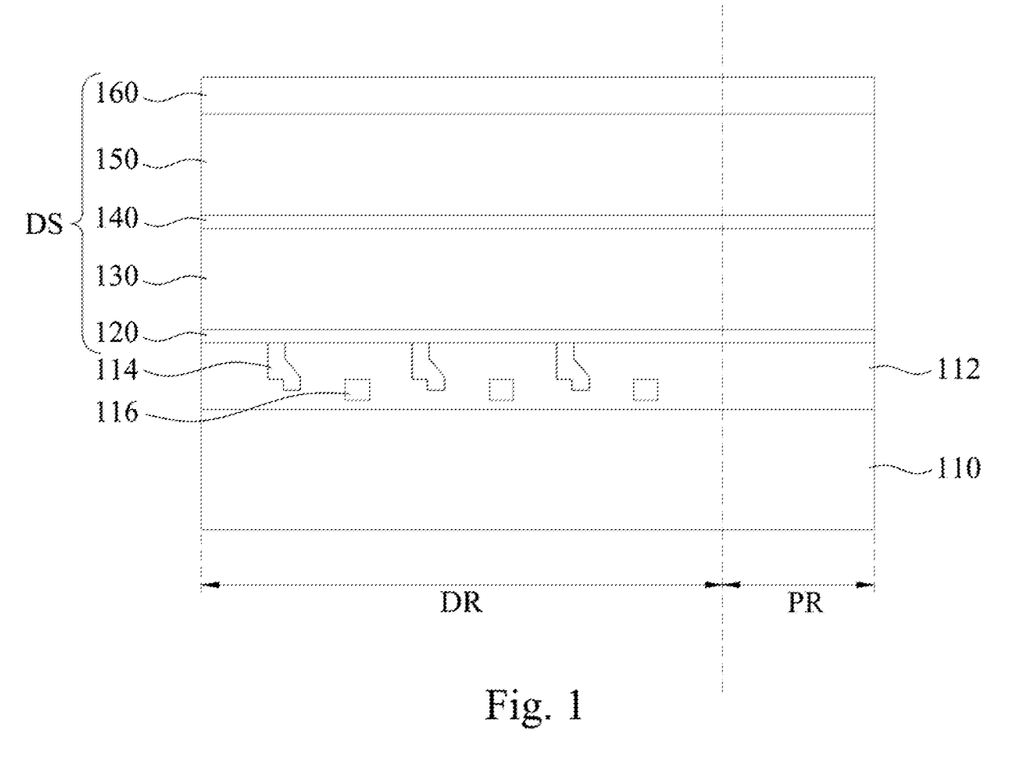
FIGS. 1-11 illustrate cross-section views of intermediate stages of a process of a semiconductor structure in accordance with some embodiments of the present disclosure.

FIGS. 1-11 illustrate cross-section views of intermediate stages of a process of a semiconductor structure in accordance with some embodiments of the present disclosure. Referring to FIG. 1, a dielectric stack DS is formed over a substrate 110. In greater details, forming the dielectric stack DS over the substrate 110 includes forming a first support layer 120 over the substrate 110, forming a first sacrificial layer 130 over the first support layer 120, forming a second support layer 140 over the first sacrificial layer 130, forming a second sacrificial layer 150 over the second support layer 140, and forming a third support layer 160 over the second sacrificial layer 150. In other words, the dielectric stack DS includes the first support layer 120, the first sacrificial layer 130, the second support layer 140, the second sacrificial layer 150 and the third support layer 160 formed in sequence.

The substrate 110 includes a device region DR and a peripheral region PR. The device region DR is a region where a semiconductor structure (e.g., capacitors) is formed. The peripheral region PR is adjacent to the device region DR. For example, the peripheral region PR surrounds the device region DR. The substrate 110 includes a dielectric layer 112. In some embodiments, the dielectric layer 112 is an interlayer dielectric (ILD) layer or an intermetal dielectric (IMD) layer. The dielectric layer 112 may be a low-k dielectric layer made of a low dielectric constant (k) material, a very low-k material, or a combination thereof. In some embodiments, the dielectric layer 112 includes nitride (e.g., silicon nitride), or other suitable dielectric material. The substrate 110 further includes landing pads 114 and bit line contacts 116 formed in the dielectric layer 112, in which the landing pads 114 and the bit line contacts 116 are located in the device region DR of the substrate 110, and the landing pads 114 and the bit line contacts 116 are not located in the peripheral region PR of the substrate 110. The landing pads 114 and/or the bit line contacts 116 may include aluminum, aluminum alloys, copper, copper alloys, titanium, titanium nitride, tantalum, tantalum nitride, tungsten, cobalt, the like, or combinations thereof. In some embodiments, the substrate 110 further includes transistors or other similar components. As a result, capacitors (e.g., capacitors Ca in FIG. 11) subsequently formed in the dielectric stack DS are connected to the other components (e.g., transistors) in the substrate 110 through the landing pads 114.

In some embodiments, the first support layer 120, the second support layer 140 and the third support layer 160 include nitride, such as silicon nitride. In some embodiments, the first sacrificial layer 130 and the second sacrificial layer 150 include oxide. The first sacrificial layer 130 and the second sacrificial layer 150 may be made of different materials. When forming the first sacrificial layer 130, dopants are doped in the first sacrificial layer 130, and the dopants include boron, phosphorus, or combinations thereof. For example, the first sacrificial layer 130 is made of boro-phospho-silicate-glass (BPSG) which is silicon oxide doped with boron and phosphorous. In some embodiments, the second sacrificial layer 150 is made of tetraethoxysilane (TEOS) oxide, or other suitable oxide material.

Figure 2:
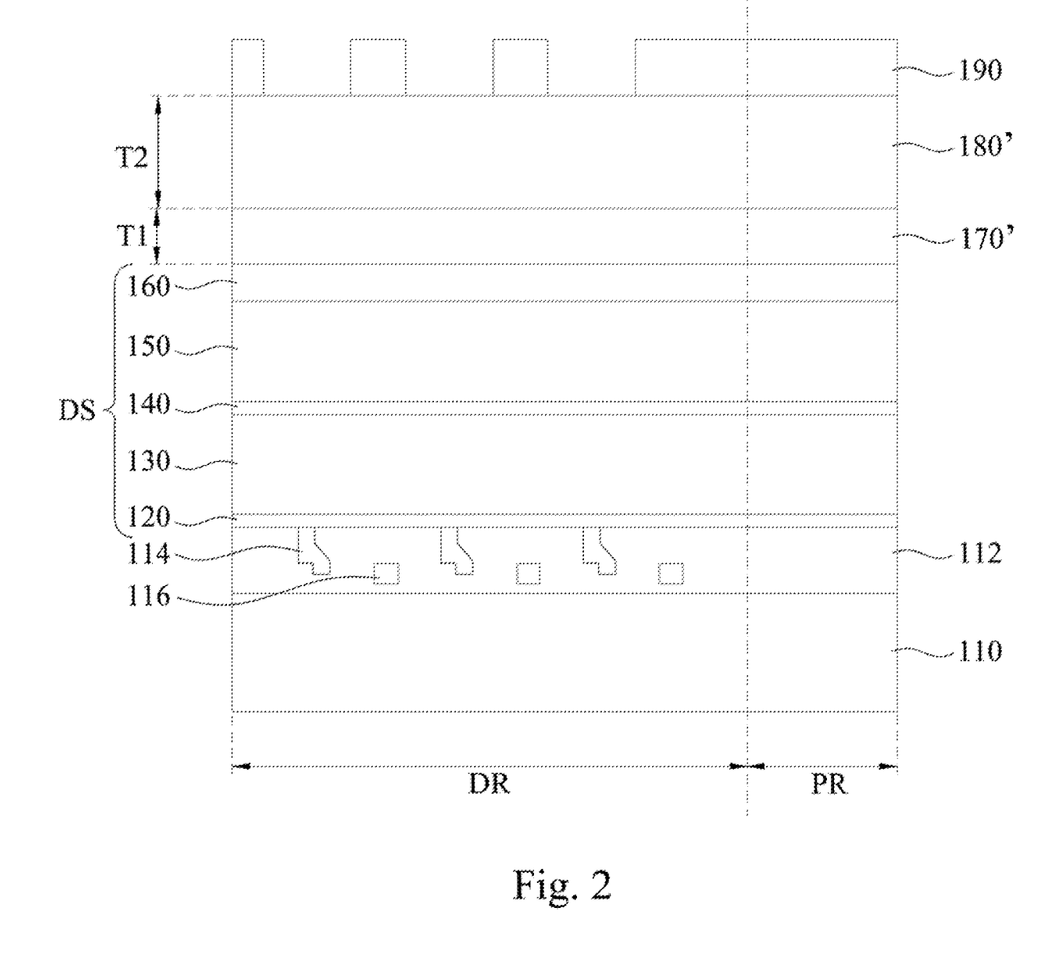

Referring to FIG. 2, after the dielectric stack DS is formed over the substrate 110, a first hard mask layer 170' is formed over the dielectric stack DS. The first hard mask layer 170' is in contact with the third support layer 160 of the dielectric stack DS. The third support layer 160 is located between the first hard mask layer 170' and the second sacrificial layer 150. A second hard mask layer 180' is then formed over the first hard mask layer 170'. The second hard mask layer 180' is in contact with the first hard mask layer 170'. The first hard mask layer 170' is located between the second hard mask layer 180' and the third support layer 160. Thereafter, a patterned mask 190 is formed over the second hard mask layer 180'. In some embodiments, the formation of the patterned mask 190 includes forming a mask layer over the second hard mask layer 180', and then patterning the mask layer (e.g., performing a dry etching process) to expose a portion of the second hard mask layer 180'. In some embodiments, the patterned mask 190 includes a material different from the first hard mask layer 170' or the second hard mask layer 180'. For example, the patterned mask 190 includes oxide (e.g., tetraethoxysilane (TEOS) oxide), the first hard mask layer 170' includes semiconductor materials (e.g., polysilicon), and the second hard mask layer 180' includes semiconductor materials (e.g., polysilicon).

Figure 3:
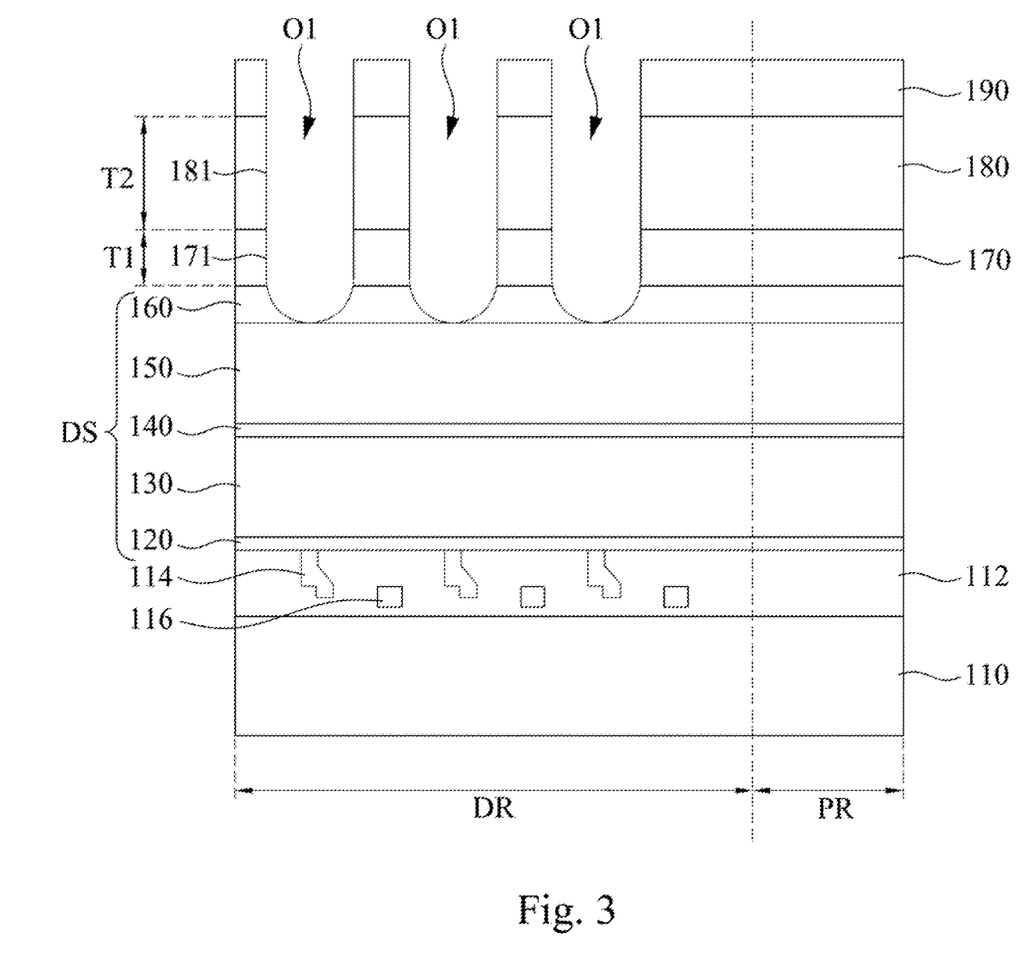

Referring to FIG. 2 and FIG. 3, performing an etching process on the first hard mask layer 170' and the second hard mask layer 180' to form a first hard mask 170 and a second hard mask 180, in which the first hard mask layer 170' is etched faster than the second hard mask layer 180'. As such, a profile of the first hard mask 170 can be improved. Further, a profile of the capacitor (e.g., the capacitor Ca in FIG. 11) formed in the subsequent etching and deposition processes can be improved and decreased capacitance of the capacitor can be avoided. The improved profile of the capacitor may enhance the balance of the capacitor and avoid the problem of pattern abnormal.

In some embodiments, the etching process is performed to etch a portion of the second hard mask layer 180' and a portion of the first hard mask layer 170' using the patterned mask 190 as an etch mask. Then, performing an etching process to etch a portion of the third support layer 160 of the dielectric stack DS. As such, openings O1 are formed in the second hard mask 180, the first hard mask 170 and the third support layer 160. Since the first hard mask layer 170' is etched faster than the second hard mask layer 180', the first hard mask 170 is laterally expanded, thereby improving the profile of the first hard mask 170. In some embodiments, each of the openings O1 has a tapered profile (e.g., U-shaped profile). Each of the openings O1 may have a first maximum width in the third support layer 160, a second maximum width in the first hard mask 170 and a third maximum width in the second hard mask 180, in which the first maximum width is smaller than the second maximum width, and the second maximum width is substantially equal to the third maximum width. In other words, the second hard mask 180 has a second exposed sidewall 181 facing the openings O1 and the first hard mask 170 has a first exposed sidewall 171 facing the openings O1, in which a slope of the second exposed sidewall 181 is substantially the same as a slope of the first exposed sidewall 171. For example, the substrate 110 has a substantially planar bottom surface that extends along a first direction, the second exposed sidewall 181 extends along a second direction perpendicular to the first direction, and the first exposed sidewall 171 extends along the second direction. In some embodiments, the openings O1 further exposes the second sacrificial layer 150 of the dielectric stack DS.

In some embodiments, the first hard mask layer 170' (first hard mask 170) has a first thickness T1 and the second hard mask layer 180' (second hard mask 180) has a second thickness T2, in which the second thickness T2 is greater than the first thickness T1. For example, the first thickness T1 of the first hard mask layer 170' is in a range of about 80 nanometers to about 40 nanometers (e.g., 60 nanometers), and the second thickness T2 of the second hard mask layer 180' is in a range of about 100 nanometers to about 140 nanometers (e.g., 120 nanometers). In some embodiments, a ratio of the second thickness T2 to the first thickness T1 is in a range of about 1.5 to about 2.5 (e.g., 2). If the ratio of the second thickness T2 to the first thickness T1 is out of the above selected ranges, the profile of the first hard mask 170 would not formed uniformly. For example, openings (e.g., openings O1) in the first hard mask 170 would be not formed through the first hard mask 170 and would not laterally expanded, and thus openings for capacitors that is formed in the subsequent etching processes would be too smaller, thereby causing the imbalance of the capacitors that is formed in the subsequent deposition processes.

The first hard mask layer 170' and the second hard mask layer 180' may include semiconductor materials, such as polysilicon or other suitable materials. The first hard mask layer 170' may include first dopants having a first conductivity type (e.g., N-type in this case) such as phosphorous (P), arsenic (As), antimony (Sb), combinations thereof, or the like. In some embodiments, an implantation process is performed on the first hard mask layer 170', followed by an annealing process to activate the implanted first dopants of the first hard mask layer 170'. The second hard mask layer 180' may include second dopants having second conductivity type (e.g., P-type in this case) such as boron (B), $BF_2$, $BF_3$, combinations thereof, or the like. In some embodiments, an implantation process is performed on the second hard mask layer 180', followed by an annealing process to activate the implanted second dopants of the second hard mask layer 180'. In some embodiments, the second dopants of the second hard mask layer 180' have different conductivity type from the first dopants of the first hard mask layer 170'.

Since the second conductivity type of the second dopants of the second hard mask layer 180' is different from the first conductivity type of the first dopants of the first hard mask layer 170', the second hard mask layer 180' and the first hard mask layer 170' are etched with different etching rate. In greater details, since the first hard mask layer 170' includes the first dopants (e.g., N-type in this case) and the second hard mask layer 180' includes the second dopants (e.g., P-type in this case), a hardness (or density) of the second hard mask layer 180' is greater than a hardness (or density) of the first hard mask layer 170'. Further, since the outer electrons of the first dopants (e.g., N-type) of the first hard mask layer 170' are more likely or easily to react with dry etchant (e.g., Br ion) because of their electronegativity than that of the second dopants (e.g., P-type) of the second hard mask layer 180', the first hard mask layer 170' with the first dopants (e.g., N-type) is etched faster than the second hard mask layer 180' with the second dopants (e.g., P-type). As a result, the profile of the first hard mask 170 can be improved. If the first hard mask layer 170' is not etched faster (e.g., lower or at the same etching rate) than the second hard mask layer 180', the openings O1 would have sharp profiles (e.g., V-shaped profile) such that the capacitors formed in the subsequent processes would not aligned with each other (e.g., a length of each capacitors is not identical). In some embodiments, a dopant concentration of the first dopants of the first hard mask layer 170' is in a range of about 0.5% to about 1.5%, and a dopant concentration of the second dopants of the second hard mask layer 180' is in a range of about 0.5% to about 1.5%. If the dopant concentration of the first dopants and/or the dopant concentration of second dopants are out of the above selected ranges, the etching rate of the first hard mask layer 170' and the etching rate of the second hard mask layer 180' would be difficult to control (e.g., difference between the etching rate of the first hard mask layer 170' and the etching rate of the second hard mask layer 180' is not significant enough), and thus the improved profile of the first hard mask 170 would not achieved.

In some embodiments, etching the first hard mask layer 170' and the second hard mask layer 180' are performed using the patterned mask 190 as an etch mask by a dry etching process. For example, a dry etchant for the dry etching process includes HBr, $NH_3$, $O_2$, combinations thereof, or other suitable gases. The second hard mask layer 180' and the first hard mask layer 170' are etched using the same dry etchant (e.g., HBr, $NH_3$, or $O_2$). In some embodiments where the dry etchant is HBr, the flow of the dry etching process is in a range of about 150 sccm to about 200 sccm. In some embodiments where the dry etchant is $NH_3$, the flow of the dry etching process is in a range of about 30 sccm to about 50 sccm. In some embodiments where the dry etchant is $O_2$, the flow of the dry etching process is in a range of about 20 sccm to about 35 sccm. If the flow of the dry etching process is out of the above selected ranges, the profile of the first hard mask 170 would not be formed uniformly (e.g., the openings O1 are too large). In some embodiments, the dry etching process utilizes a power in a range of about 1500 Watts to about 200 Watts. If the power of the dry etching process is out of the above selected ranges, the openings O1 would be under-etch (e.g., the openings O1 not through the first hard mask layer 170'). In some embodiments, etching the third support layer 160 is performed by a dry etching process after etching the first hard mask layer 170' and the second hard mask layer 180'. For example, a dry etchant for the dry etching process of the third support layer 160 includes $SF_6$, $Cl_2$, combinations thereof, or other suitable gases. The third support layer 160 is etched using different dry etchant from the second hard mask layer 180' (or the first hard mask layer 170').

Figure 4:
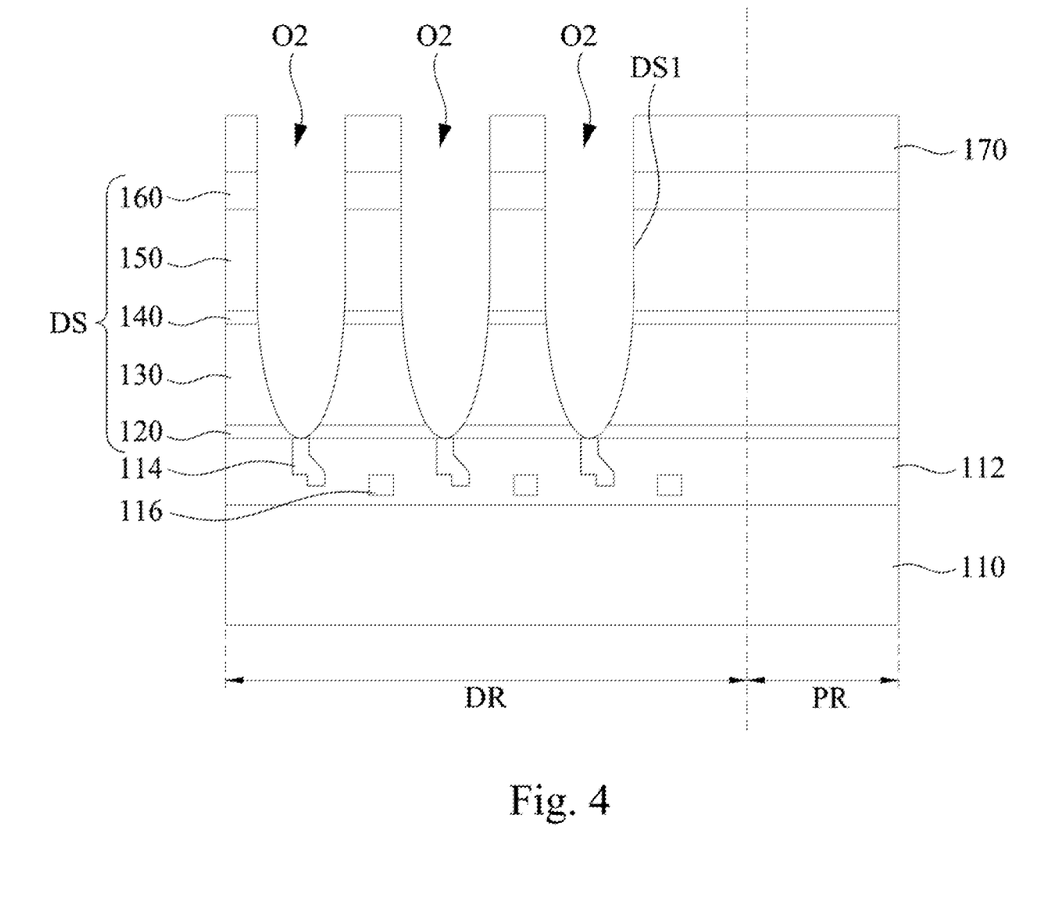

Referring to FIG. 3 and FIG. 4, after forming the openings O1, openings O2 are formed in the dielectric stack DS to expose the substrate 110. In other words, the dielectric stack DS is continued to be etched along the openings O1 to form the openings O2. The opening O2 is formed in the dielectric stack DS using the first hard mask 170 as an etch mask. The openings O2 may expose sidewalls DS1 of the dielectric stack DS. In some embodiments, the patterned mask 190 and the second hard mask 180 are removed in sequence prior to forming the openings O2.

In some embodiments, etching the dielectric stack DS to form the openings O2 includes multiple etching processes. For example, the second sacrificial layer 150 is etched to expose the second support layer 140, the second support layer 140 is etched to expose the first sacrificial layer 130, the first sacrificial layer 130 is etched to expose the first support layer 120, and the first support layer 120 is etched to expose the landing pads 114 of the substrate 110.

Figure 5:
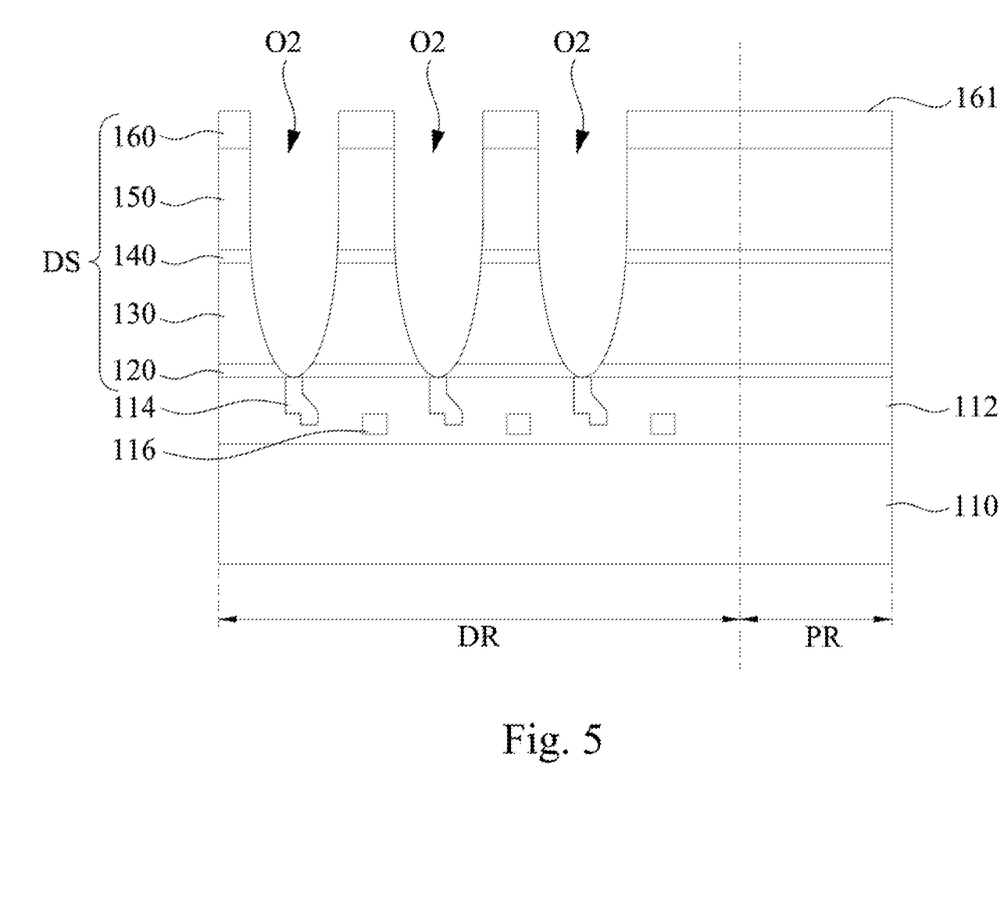

Referring to FIG. 4 and FIG. 5, after forming the openings O2 in the dielectric stack DS, the first hard mask 170 is removed such that a top surface 161 of the third support layer 160 of the dielectric stack DS is exposed. In some embodiments, removing the first hard mask 170 is performed by a dry etching process.

Referring to FIGS. 6-11, capacitors Ca are formed in the openings O2 (see FIG. 5) of the dielectric stack DS. Discussed in greater details, referring to FIG. 5 and FIG. 6, bottom electrode layers 200 are formed in the openings O2 of the dielectric stack DS. The bottom electrode layers 200 may include curved portions 202 and horizontal portions 204 connected to the curved portions 202, in which the curved portions 202 are located along the sidewall DS1 of the dielectric stack DS and in contact with the landing pads 114 of the substrate 110, and the horizontal portions 204 is located over the curved portions 202 and the third support layer 160 of the dielectric stack DS. In some embodiments, the bottom electrode layers 200 include titanium nitride (TiN) or other suitable conductive materials.

Figure 6:
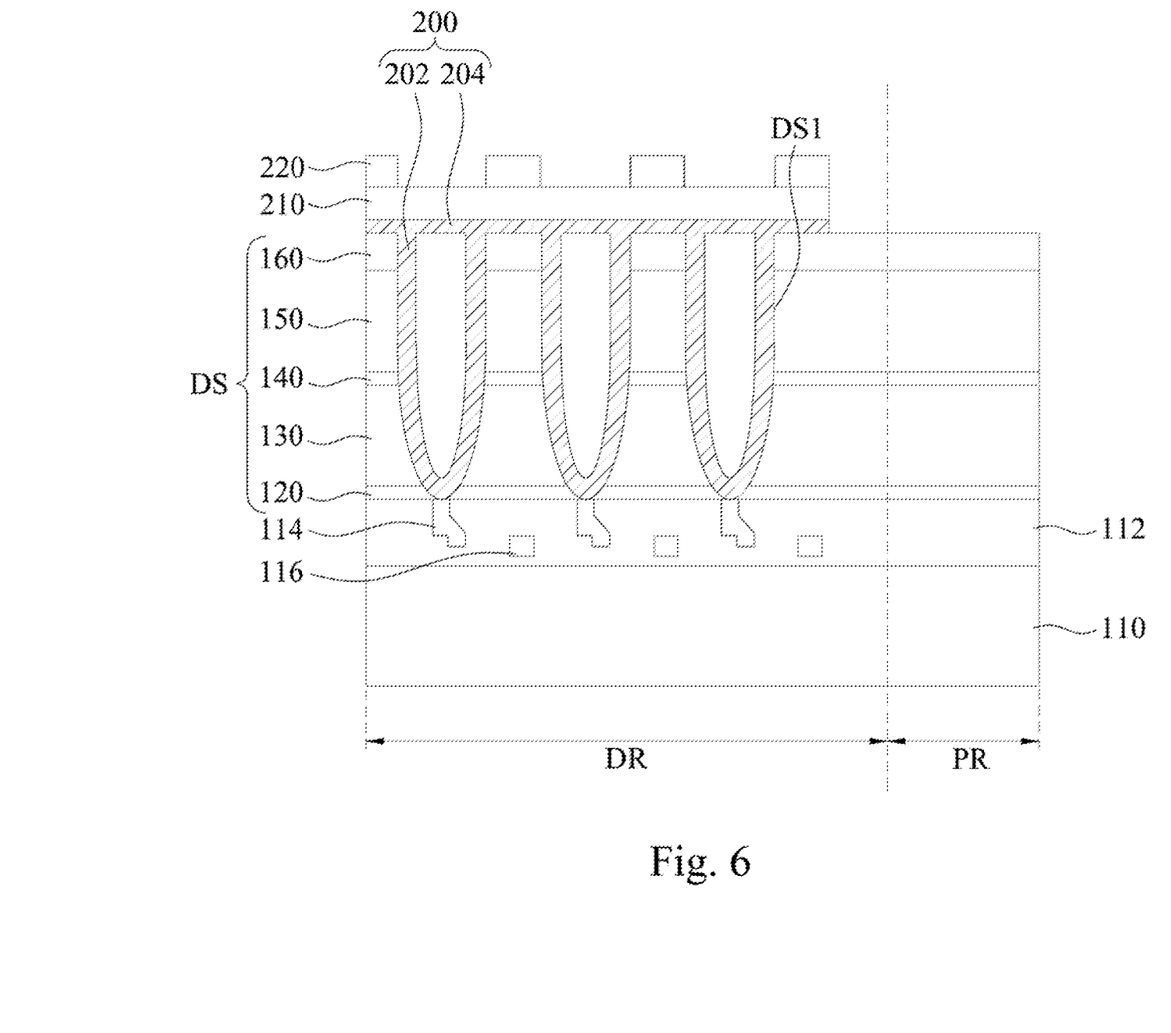

After the bottom electrode layers 200 are formed, a mask 210 is formed over the bottom electrode layers 200. The mask 210 is in contact with the bottom electrode layers 200. The formation of the mask 210 may include forming a mask layer over the horizontal portion 204 of bottom electrode layer 200, and then patterning the mask layer to expose the horizontal portion 204 of bottom electrode layer 200. The bottom electrode layers 200 are etched to expose underlying third support layer 160 using the mask 210 as an etch mask. In some embodiments, the mask 210 and the third support layer 160 include the same materials, such as silicon nitride.

Thereafter, a patterned mask 220 is formed over the mask 210. The formation of the patterned mask 220 may include forming a mask layer over the mask 210, and then patterning the mask layer to expose a portion of the mask 210. The patterned mask 220 is in contact with the mask 210. In some embodiments, the patterned mask 220 includes oxide, such as tetraethoxysilane (TEOS) oxide, silicon oxide or other suitable materials. In some other embodiments, the patterned mask 220 includes the same material as that of the first sacrificial layer 130 or the second sacrificial layer 150. The patterned mask 220 may have a different material from that of the mask 210. For example, the patterned mask 220 includes silicon oxide, and the mask 210 includes silicon nitride.

Figure 7:
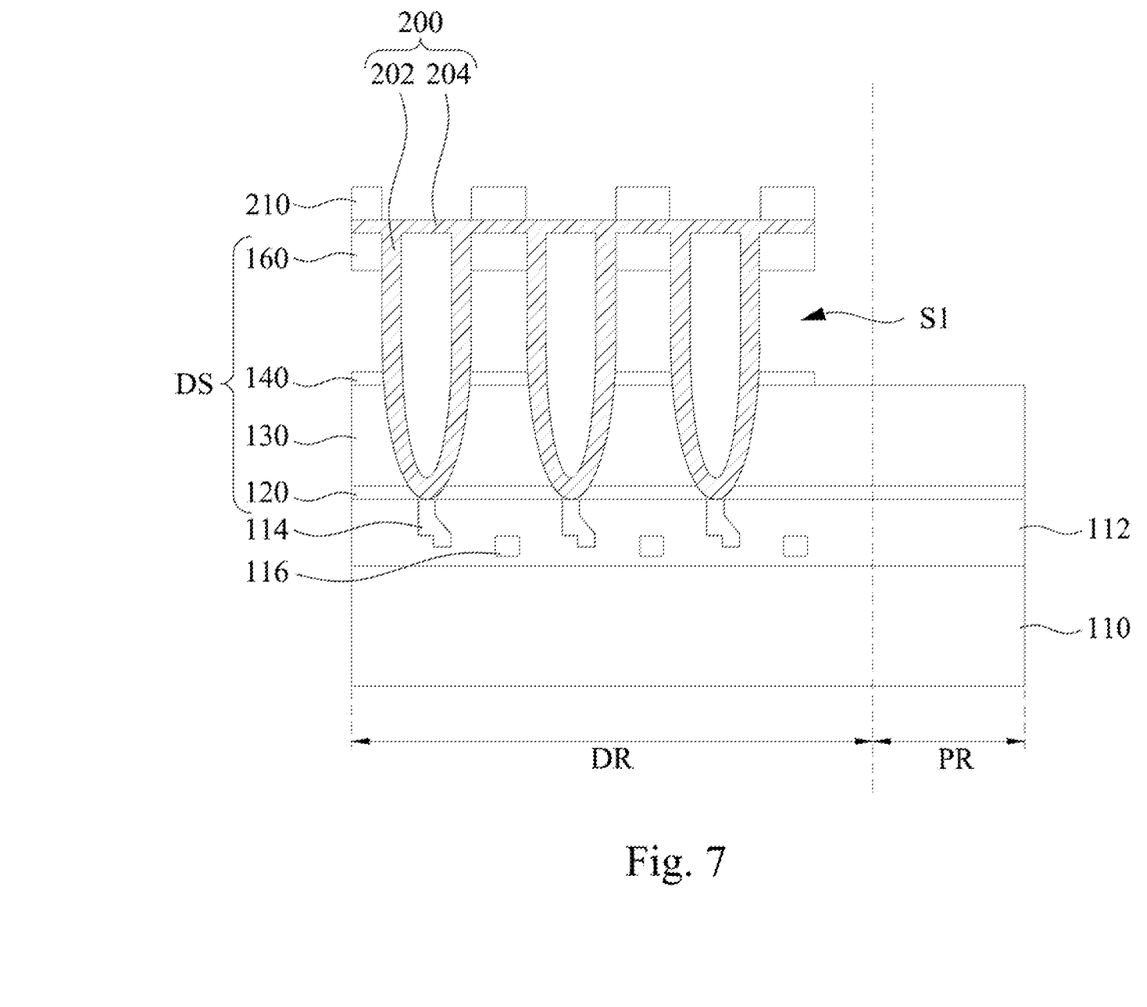

Referring to FIG. 6 and FIG. 7, the mask 210 is etched to expose the bottom electrode layers 200 using the patterned mask 220 as an etch mask. Further, the third support layer 160 is etched to expose the second sacrificial layer 150 using the patterned mask 220 as the etch mask. In some embodiments, the mask 210 and the third support layer 160 are etched simultaneously by using one etching process.

Thereafter, performing an etching process to remove an entirety of the second sacrificial layer 150 of the dielectric stack DS such that the second support layer 140 is exposed. In some embodiments, the second sacrificial layer 150 is removed by using a wet etching process, and an etch solution thereof includes fluoride-based solution, such as hydrogen fluoride (HF). After removing the second sacrificial layer 150, spaces S1 are formed between the second support layer 140 and the third support layer 160. In some embodiments, a portion of the second support layer 140 is etched to align with the third support layer 160. In some embodiments, during the etching process, the patterned mask 220 is simultaneously removed to expose the mask 210. In other words, the patterned mask 220 and the second sacrificial layer 150 are removed simultaneously using one etching process.

Figure 8:
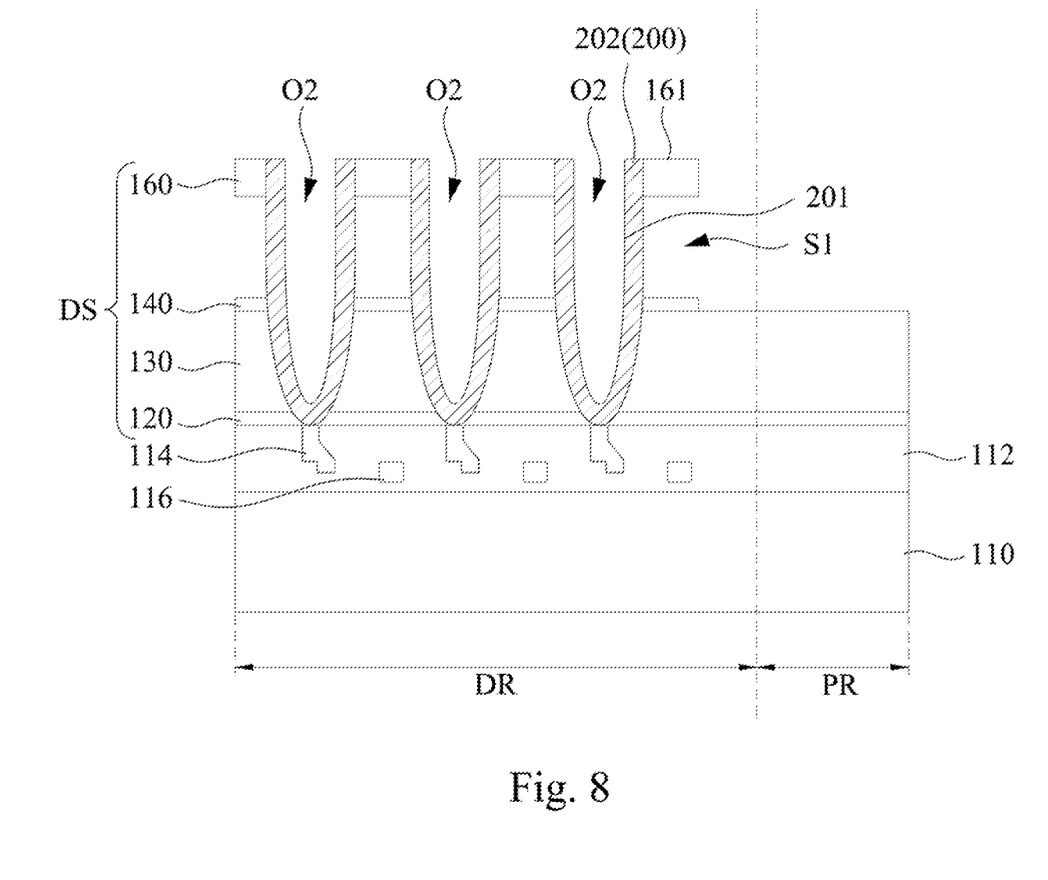

Referring to FIG. 7 and FIG. 8, the mask 210 is removed after removing the second sacrificial layer 150. In some embodiments, etching the mask 210 is performed by a dry etching process. Thereafter, the horizontal portions 204 of the bottom electrode layers 200 are removed, while leaving the curved portions 202 of the bottom electrode layers 200 remained. As such, each of the bottom electrode layers 200 has U-shaped profile. The top surface 161 of the third support layer 160 is exposed and sidewalls 201 of the bottom electrode layers 200 are exposed through the openings O2. In some embodiments, etching the horizontal portions 204 of the bottom electrode layers 200 is performed by a dry etching process.

Figure 9:
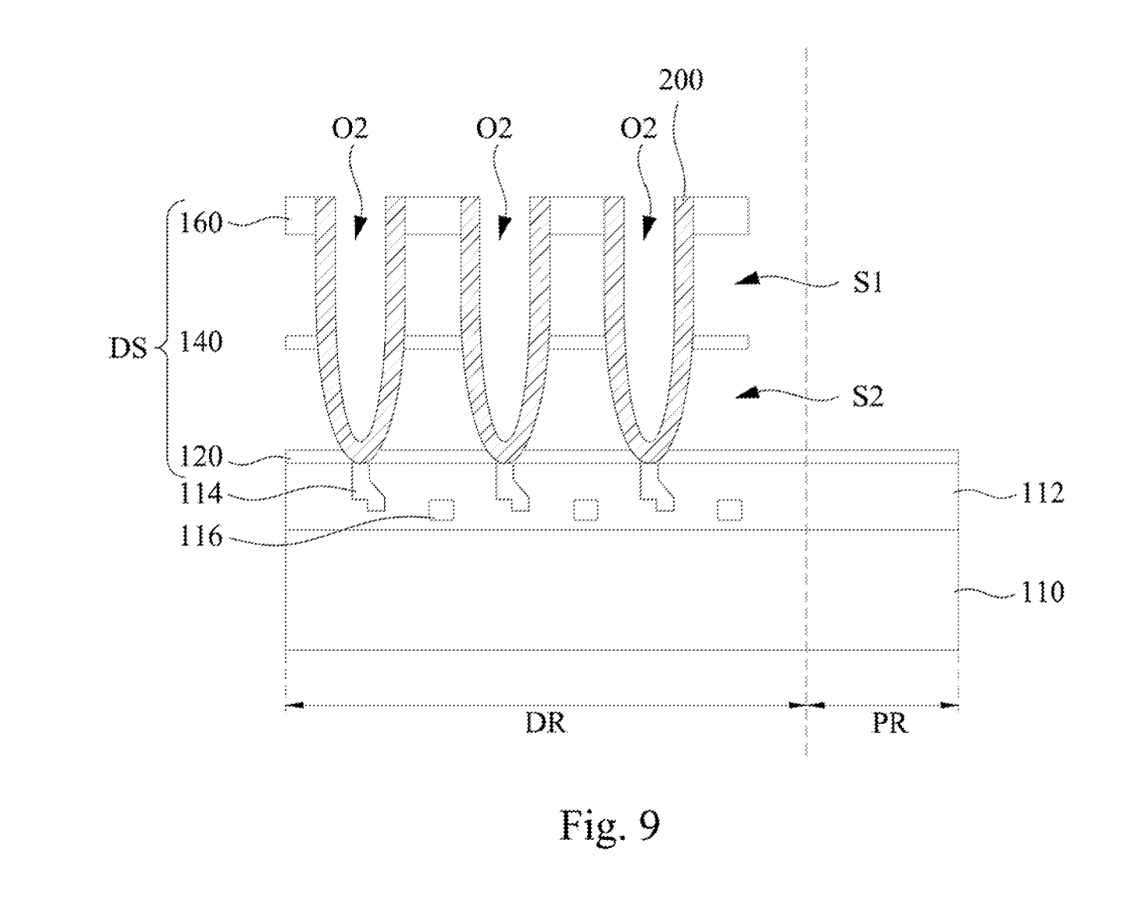

Referring to FIG. 8 and FIG. 9, an entirety of the first sacrificial layer 130 of the dielectric stack DS is removed. In some embodiments, an etching process is performed to remove the first sacrificial layer 130. For example, the first sacrificial layer 130 is removed by using a wet etching process, and an etch solution thereof includes fluoride-based solution, such as hydrogen fluoride (HF). After removing the first sacrificial layer 130, spaces S2 are formed between the second support layer 140 and the first support layer 120. The first support layer 120, the second support layer 140 and the third support layer 160 are connected by the bottom electrode layers 200.

Figure 10:
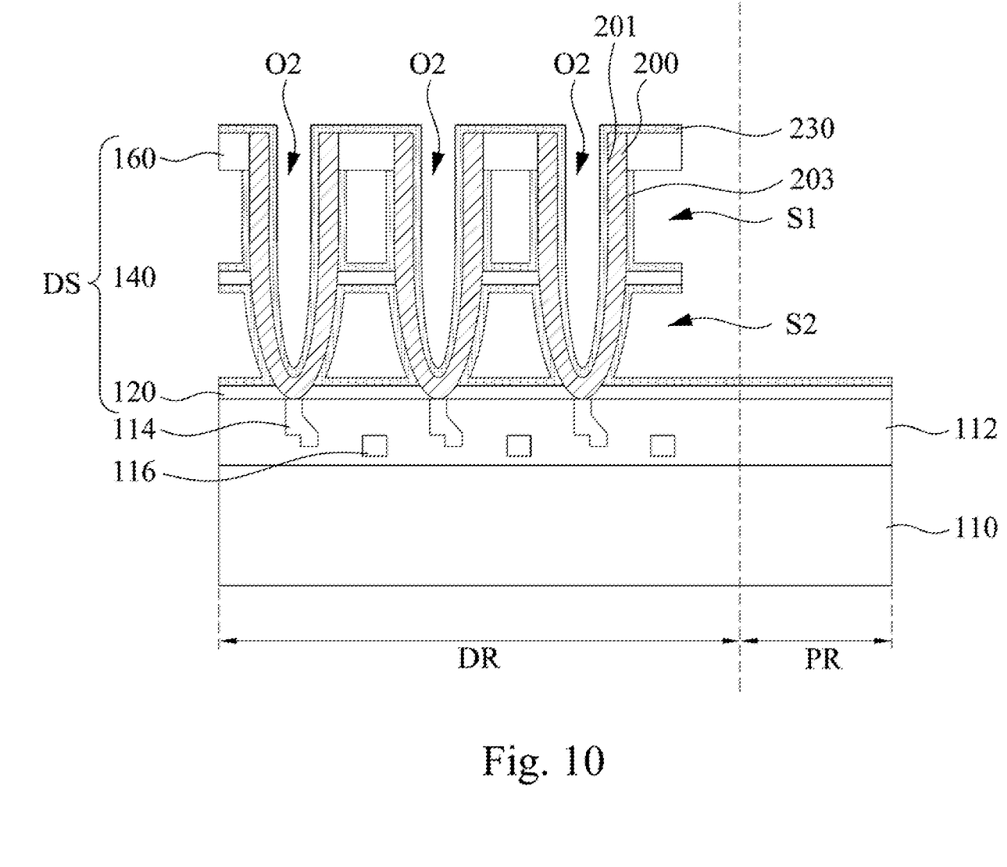

Referring to FIG. 10, high-k dielectric layers 230 are formed along sidewalls of the bottom electrode layers 200. The high-k dielectric layers 230 may be formed along the sidewalls 203 of the bottom electrode layers 200 in the spaces S1 and the spaces S2. The high-k dielectric layers 230 may also be formed along the sidewalls 201 of the bottom electrode layers 200 in the openings O2 of the second dielectric stack DS. Further, the high-k dielectric layers 230 may be formed along the top surface and the bottom surface of the second support layer 140 and the third support layer 160, and the high-k dielectric layers 230 may be formed along the top surface of the first support layer 120. In some embodiments, the high-k dielectric layers 230 include hafnium oxide (HfO). In various examples, the high-k dielectric layers 230 include metal oxide (such as $HfSiO_2$, ZnO, $ZrO_2$, $Ta_2O_5$, $Al_2O_3$, or the like), metal nitride, or combinations thereof.

Figure 11:
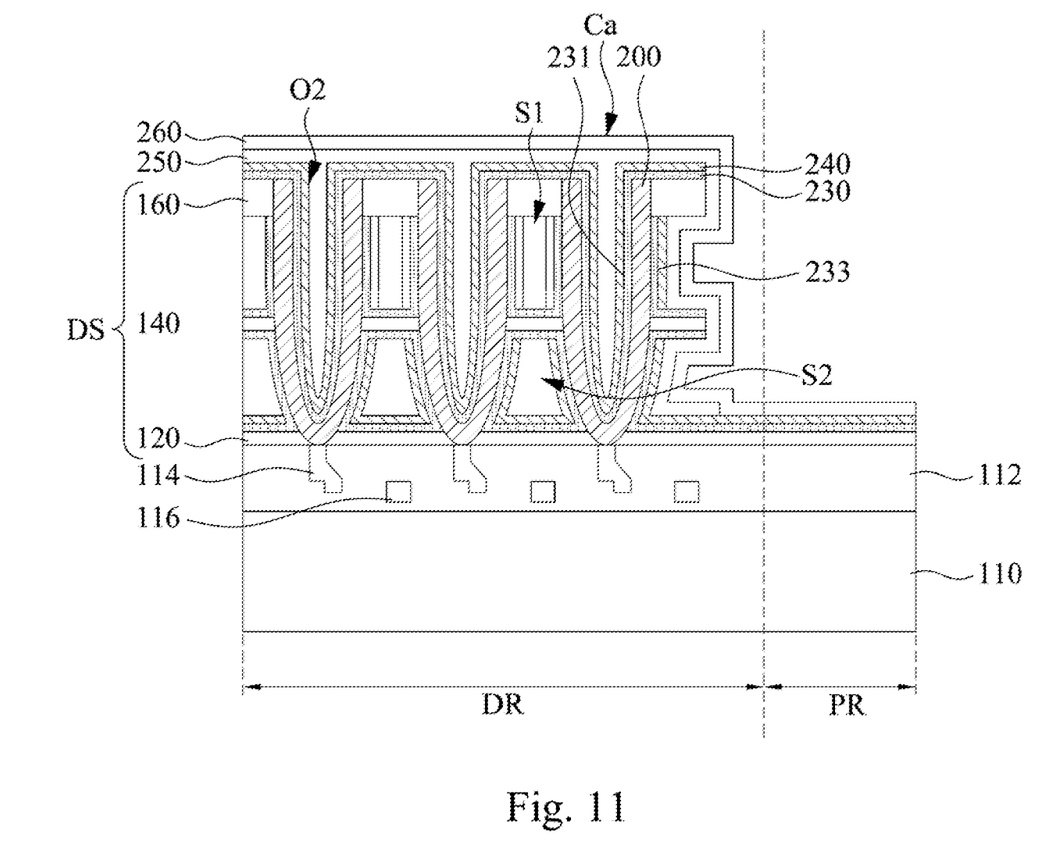

Referring to FIG. 10 and FIG. 11, first electrode layers 240 are formed along the high-k dielectric layers 230. The first electrode layers 240 may be formed along sidewalls 233 of the high-k dielectric layers 230 in the spaces S1 and the spaces S2. The first electrode layers 240 may also be formed along sidewalls 231 of the high-k dielectric layers 230 in the openings O2 of the dielectric stack DS. In some embodiments, the first electrode layers 240 are located over a horizontal surface of the high-k dielectric layers 230. The first electrode layers 240 may include titanium nitride (TiN), or other suitable conductive materials. In some embodiments, the first electrode layers 240 and the bottom electrode layers 200 include the same materials.

After the first electrode layers 240 are formed, semiconductor layers 250 are formed in the spaces S1 between the first support layer 120 and the second support layer 140, and the spaces S2 between the second support layer 140 and the third support layer 160. The semiconductor layers 250 may entirely fill the openings O2 of the dielectric stack DS. The semiconductor layers 250 may also be in contact and cover the first electrode layers 240 over the third support layer 160. The semiconductor layers 250 may include polysilicon or other suitable semiconductive materials. The semiconductor layers 250 have a material different from that of the first electrode layers 240 or bottom electrode layers 200.

After forming the semiconductor layers 250 are formed, second electrode layers 260 are formed over the semiconductor layers 250. The second electrode layers 260 are formed along a top surface and sidewalls of the semiconductor layers 250. The second electrode layers 260 may also be in contact and cover the semiconductor layers 250. The second electrode layers 260 may include metal (e.g., tungsten) or other suitable conductive materials. The second electrode layers 260 have a material different from that of the first electrode layers 240 or bottom electrode layers 200. The first electrode layers 240, the semiconductor layers 250 and the second electrode layers 260 may have the same electrical potential. In some embodiments, the first electrode layers 240 are referred as top electrode layers of capacitors Ca. In some other embodiments, the first electrode layers 240 and the semiconductor layers 250 are referred as the top electrode layers of the capacitors Ca. Alternatively, the first electrode layers 240, the semiconductor layers 250 and the second electrode layers 260 are referred as the top electrode layers of the capacitors Ca. After the top electrode layers (i.e., the first electrode layers 240, the semiconductor layers 250 and/or the second electrode layers 260) are formed, the capacitors Ca including the bottom electrode layers 200, the high-k dielectric layers 230 and the top electrode layers are defined in the openings O2 of the dielectric stack DS and in the spaces S1 and the spaces S2.

In some embodiments, a semiconductor structure includes a plurality of support layers (i.e., the first support layer 120, the second support layer 140 and the third support layer 160) and the capacitors Ca. The first support layer 120, the second support layer 140 and the third support layer 160 are arranged from bottom to top, and the first support layer 120, the second support layer 140 and the third support layer 160 are spaced apart from each other. In other words, the third support layer 160 is located above the second support layer 140, and the second support layer 140 is located above the first support layer 120. In some embodiments, a width of the third support layer 160 is greater than a width of the second support layer 140 or a width of the first support layer 120. Each of the capacitors Ca includes the bottom electrode layer 200, the high-k dielectric layer 230 and the top electrode layer (i.e., the first electrode layer 240, the semiconductor layer 250 and/or the second electrode layer 260). The capacitors Ca may have U-shaped profile in the dielectric stack DS. It is noted that the capacitors Ca in FIG. 11 are illustrative, and the capacitors Ca are not limited to the configuration illustrated in FIG. 11. For example, additional layers are included in the capacitors Ca.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    forming a dielectric stack over a substrate, wherein forming the dielectric stack comprises forming a first support layer, a first sacrificial layer, a second support layer, a second sacrificial layer and a third support layer in sequence;
    forming a first hard mask layer over the dielectric stack;
    forming a second hard mask layer over the first hard mask layer, wherein the first hard mask layer and the second hard mask layer comprise semiconductor materials;
    forming a patterned mask over the second hard mask layer;
    etching the first hard mask layer and the second hard mask layer using the patterned mask as an etch mask to form a first hard mask and a second hard mask, wherein the first hard mask layer is etched faster than the second hard mask layer;
    forming an opening in the dielectric stack to expose the substrate; and
    forming a bottom electrode layer in the opening of the dielectric stack.

2. The method of claim 1, further comprising:
    etching the third support layer of the dielectric stack after etching the first hard mask layer and the second hard mask layer.

3. The method of claim 2, wherein etching the third support layer is performed such that the second sacrificial layer of the dielectric stack is exposed.

4. The method of claim 1, wherein etching the first hard mask layer and the second hard mask layer is performed such that the first hard mask has a first exposed sidewall and the second hard mask has a second exposed sidewall, and a slope of the second exposed sidewall is substantially the same as a slope of the first exposed sidewall.

5. The method of claim 1, wherein the first hard mask layer comprises first dopants having a first conductivity type, and the second hard mask layer comprises second dopants having a second conductivity type different from the first conductivity type.

6. The method of claim 1, wherein the first hard mask layer has a first thickness, the second hard mask layer has a second thickness, and the second thickness is greater than the first thickness.

7. The method of claim 1, further comprising:
removing the patterned mask prior to forming the opening.

8. The method of claim 1, further comprising:
removing the second hard mask prior to forming the opening.

9. The method of claim 1, further comprises:
forming a high-k dielectric layer along a sidewall of the bottom electrode layer; and
forming a top electrode layer along a sidewall of the high-k dielectric layer to define a capacitor comprising the bottom electrode layer, the high-k dielectric layer and the top electrode layer in the dielectric stack.

10. A method of forming a semiconductor structure, comprising:
forming a dielectric stack over a substrate;
forming a first hard mask and a second hard mask over the dielectric stack, wherein the first hard mask comprises first dopants having a first conductivity type, and the second hard mask comprises second dopants having a second conductivity type different from the first conductivity type;
forming an opening in the dielectric stack using the first hard mask as an etch mask to expose the substrate; and
forming a bottom electrode layer in the opening of the dielectric stack.

11. The method of claim 10, wherein forming the first hard mask and the second hard mask is performed such that the first hard mask is in contact with the dielectric stack and the second hard mask is in contact with the first hard mask.

12. The method of claim 10, wherein the first hard mask and the second hard mask comprise polysilicon materials.

13. The method of claim 10, wherein a dopant concentration of the first dopants is in a range of 0.5% to 1.5%, and a dopant concentration of the second dopants is in a range of 0.5% to 1.5%.

14. The method of claim 10, wherein the first hard mask has a first thickness, the second hard mask has a second thickness, and the second thickness is greater than the first thickness.

15. The method of claim 10, further comprising:
removing the first hard mask prior to forming the opening in the dielectric stack.

16. The method of claim 10, wherein forming the dielectric stack comprises:
forming a first sacrificial layer over the substrate; and
forming a second sacrificial layer over the first sacrificial layer.

17. The method of claim 16, wherein forming the dielectric stack further comprises:
forming a first support layer over the substrate;
forming a second support layer over the first sacrificial layer; and
forming a third support layer over the second sacrificial layer.

18. The method of claim 17, further comprising:
removing the second sacrificial layer after forming the bottom electrode layer; and
removing the first sacrificial layer to expose the first support layer.

19. The method of claim 10, further comprises:
forming a high-k dielectric layer along a sidewall of the bottom electrode layer; and
forming a top electrode layer along a sidewall of the high-k dielectric layer to define a capacitor comprising the bottom electrode layer, the high-k dielectric layer and the top electrode layer in the dielectric stack.

* * * * *